(12) United States Patent
Schoner

(10) Patent No.: US 6,728,327 B1
(45) Date of Patent: Apr. 27, 2004

(54) LOWER-JITTER PHASE-LOCKED LOOP

(75) Inventor: Brian Schoner, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/477,658

(22) Filed: Jan. 5, 2000

(51) Int. Cl.[7] ............................. H03D 3/24; H03K 3/17
(52) U.S. Cl. ..................... 375/376; 327/175; 700/280
(58) Field of Search ............................... 375/211, 355, 375/374, 376; 327/141, 175, 276; 331/2, 17; 359/161

(56) References Cited

U.S. PATENT DOCUMENTS

| | | | | |
|---|---|---|---|---|
| 4,970,474 A | * | 11/1990 | Kennedy et al. ............... | 331/2 |
| 5,710,720 A | * | 1/1998 | Algrain et al. ............... | 700/280 |
| 6,356,129 B1 | * | 3/2002 | O'Brien et al. ............. | 327/175 |
| 6,469,550 B1 | * | 10/2002 | Kurd ........................... | 327/141 |

* cited by examiner

Primary Examiner—Chieh M. Fan
Assistant Examiner—Edith Chang
(74) Attorney, Agent, or Firm—Suiter. West PC LLO

(57) ABSTRACT

A circuit combines the outputs of two or more phase locked loops to reduce jitter to a level below that of an individual phase locked loop. A digital version of the circuit uses a majority function to determine the median value of the phase locked loops. An analog version of the circuit averages the outputs of the phase locked loops.

11 Claims, 2 Drawing Sheets

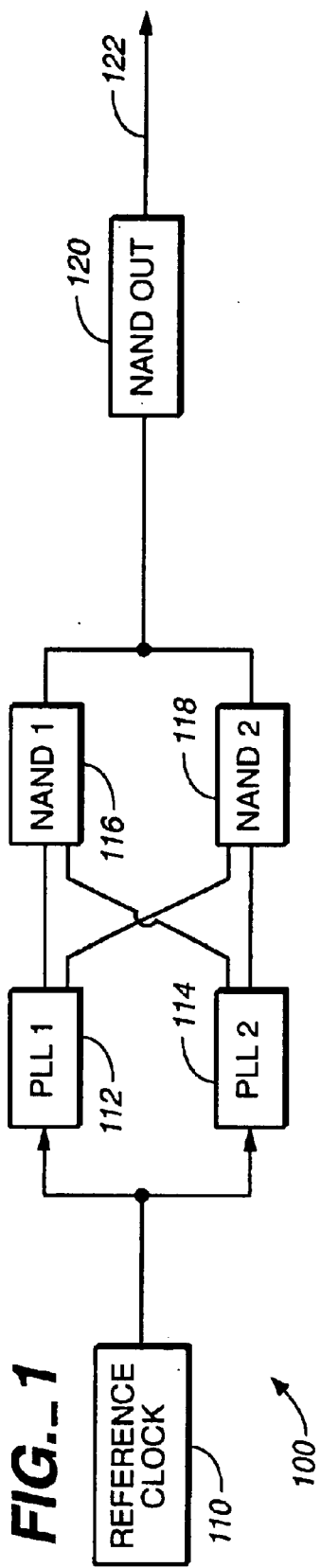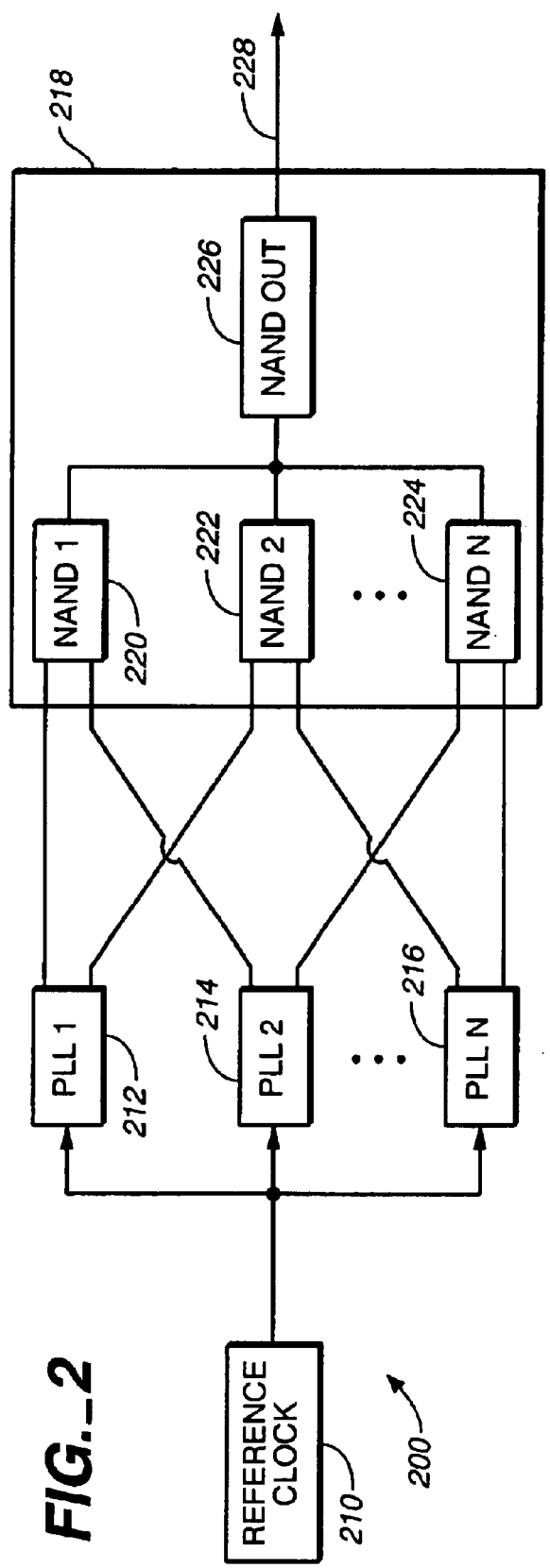

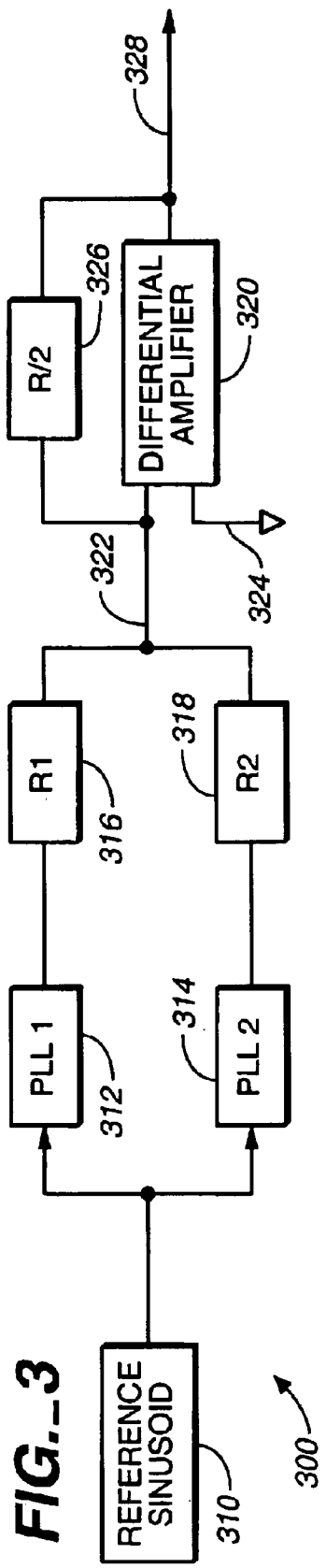
FIG._3
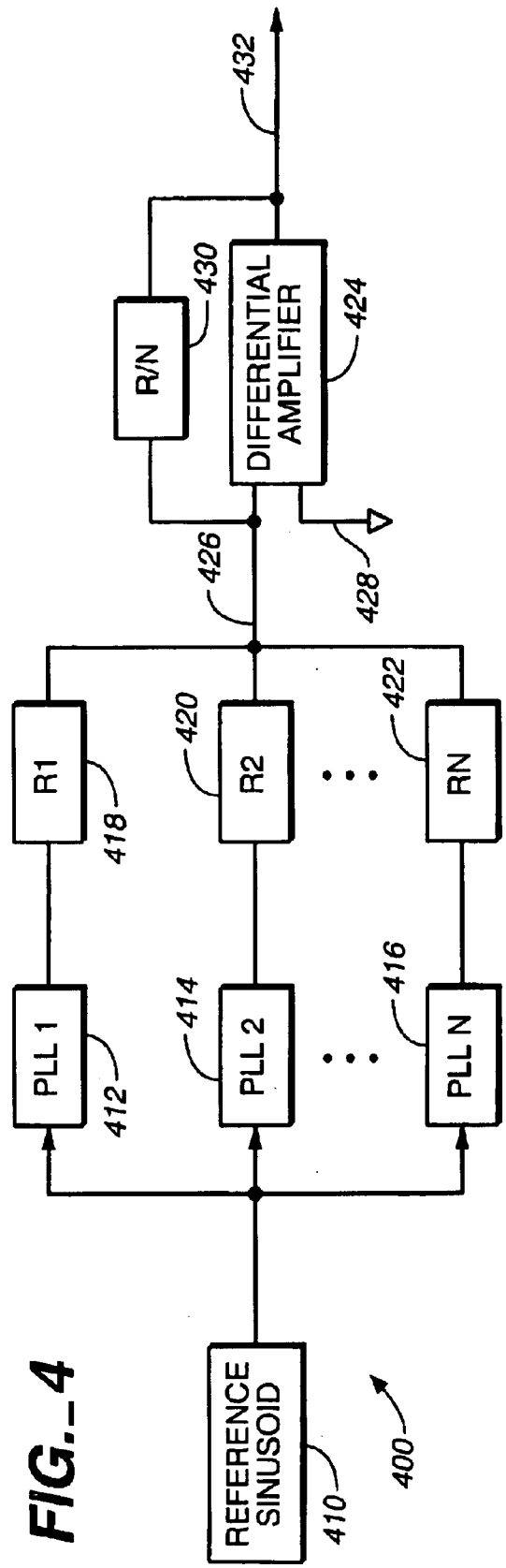
FIG._4

LOWER-JITTER PHASE-LOCKED LOOP

BACKGROUND

Electronic systems such as digital clocks or circuits for synthesizing analog frequencies typically require a clock signal having a lower jitter in its output. Clock jitter refers to fluctuation in the phase of a signal and also encompasses phase noise. A crystal reference may be utilized to provide a lower jitter, however crystals are relatively expensive and difficult to integrate with an integrated circuit. A phase-locked loop (PLL) may be utilized to generate a clock signal, however the output of a phase-locked loop generally have an unacceptable amount of jitter for certain applications. Jitter in a PLL may be reduced by designing the PLL with a higher precision loop filter, a higher precision phase comparator, or a higher-order feedback network. However, these techniques for reducing PLL jitter are disadvantageous in that a larger area on an integrated circuit is required, and lock-in time, circuit complexity, and noise sensitivity are increased.

BRIEF DESCRIPTION OF THE DRAWINGS

The numerous advantages of the present invention may be better understood by those skilled in the art by reference to the accompanying figures in which:

FIG. 1 is a block diagram of a phase-locked loop circuit having a digital output in accordance with the present invention;

FIG. 2 is a block diagram of a general phase-locked loop circuit having a digital output in accordance with the present invention;

FIG. 3 is a block diagram of a phase-locked loop circuit having an analog output in accordance with the present invention; and FIG. 4 is a block diagram of a general phase-locked loop circuit having an analog output in accordance with the present invention.

DETAILED DESCRIPTION

Reference will now be made in detail to at least one or more embodiments of the invention, an example of which is illustrated in the accompanying drawings.

Referring now to FIG. 1, a block diagram of a phase-locked loop circuit having a digital output in accordance with the present invention will be discussed. Phase-locked loop 100 includes first and second phase-locked loops (PLL) 112 and 114 for generating an output having a predetermined frequency in response to a reference signal or clock 110. In one embodiment, phase-locked loop 100 is capable of providing a digital output 122 from reference signal 110 where reference signal 110 is a digital reference signal. PLLs 112 and 114 produce an output having a frequency proportional to the frequency of reference signal 110. The jitter in the output signals of PLLs 112 and 114 has a first value. The outputs of PLLs 112 and 114 is applied to NAND gates 116 and 118 as shown, and the outputs of NAND gates 116 and 118 is applied to NAND gate 120 to provide an output 122 of phase-locked loop 100. NAND gates 116, 118 and 120 combine the outputs of PLLs 112 and 114 such that output 122 represents a median value of the outputs of PLLs 112 and 114. By so combining the outputs of PLLs 112 and 114, output 122 has a second jitter that is less than the first jitters of the outputs of PLLs 112 and 114.

In the present invention, a lower jitter such as a clock signal or the like is generated by combining several clocks each having a higher jitter output so that the combined output is a lower jitter output. The jitter (i.e., phase noise) of each clock may be described by a Gaussian distribution. Each clock has a standard deviation of sigma, but the average of N clocks would have a standard deviation of sigma divided by the square root of N where N is the number of clocks. For example, in one embodiment, by taking the average of four clocks, the standard deviation of the jitter can be reduced by half. In a circuit composed of digital logic cells, a circuit that provides an output being representative of the median value of the outputs of a combination of clock circuits to approximate an average value of the combination is utilized. As shown in FIG. 1, such a circuit comprises NAND gates 116, 118, and 120.

Referring now to FIG. 2, a block diagram of a general phase-locked loop circuit having a digital output in accordance with the present invention will be discussed. Phase-locked loop 200 may be considered as a more general form of phase-locked loop 100 of FIG. 1. In FIG. 1, a reference signal is applied to phase-locked loops 212, 214, up to PLL N 216. As shown in FIG. Any number of PLLs may be utilized, up to the N phase-locked loops. In one embodiment, N is equal to three, however any number of PLLs may be utilized. The greater the number of PLLs utilized, the lesser the resulting jitter in output 228 compared to the output jitter in the outputs of PLLs 212–216. The outputs of PLLs 212–216 are combined as shown with NAND gates 220, 222 and 224 the outputs of which are combined in turn by NAND gate 226 to provide output 228. NAND gates 220–226 provide an output 228 that is representative of the median value of the outputs of PLLs 212–216. NAND gates 220–226 thereby implement a majority function circuit 218. One having skill in the art would appreciate that NAND gates 220–226 may be substituted by other circuits or elements that are equivalent to NAND gates 220–226 without providing a substantial change in either the structure or function of NAND gates 220–226. For example, NAND gates 220–226 may be substituted with NOR gates. In addition, other functions besides a majority function may be implemented to provide a median or average-like value. For example, a median valued output could be applied in several stages to produce a pseudo-median function, such as by combining four median functions having three inputs each to provide a nine-input pseudo-median.

Referring now to FIG. 3, a block diagram of a phase-locked loop circuit having an analog output in accordance with the present invention will be discussed. Phase-locked loop circuit 300 of FIG. 3 may be utilized where it is desired to provide an analog output 328 with a reference signal 310 where the reference signal is a sinusoid. Reference signal 310 is provided to PLLs 312 and 314 that each provide an output having a predetermined frequency and first jitter value. The outputs of PLLs 312 and 314 are combined using resistors 316 and 316 and applied to an input 322 of amplifier 320 to provide output 328 such that output 328 has a second jitter that is less than the first jitter of PLLs 312 and 314. A feedback resistor 326 may be used to couple output 328 to input 322. In one embodiment, feedback resistor 326 has a resistance that is equal to the resistances of resistors 316 and 318 divided by the number of resistors 316 and 318 which is two as shown in FIG. 3. In one embodiment, amplifier 320 may be a differential amplifier, for example an operational amplifier, wherein the outputs of PLLs 312 and 314 are applied to an inverting input 322 of amplifier 320 and a non-inverting input 324 is coupled to a reference signal (e.g., ground). One having skill in the art would appreciate that amplifier 320 need not be a differential amplifier, for example amplifier 320 may be implemented with a single transistor. In an analog implementation, the outputs of a plurality of individual phase-locked loops are combined by providing an output that is representative of the average value of the outputs of the individual phase locked loops. By averaging the value of sinusoid outputs, for smaller values of jitter (phase error), averaging the sinusoid outputs of the PLLs is approximately equivalent to averaging the jitter of the sinusoid outputs.

Referring now to FIG. 4, a block diagram of a general phase-locked loop circuit having an analog output in accordance with the present invention will be discussed. Phase-locked loop 400 of FIG. 4 may be considered as a generic version of phase-locked loop 300 of FIG. 3. A reference signal 410 is applied to PLLs 412, 414, up to PLL N 416. Any number, N, of phase locked loops may be used. In one embodiment, N is equal to three. The outputs of PLLs 412–416 each have a first jitter value and are applied to amplifier 424 via resistors 418, 420 and 422 to provide output 432. As discussed with respect to amplifier 320, amplifier 424 may be a differential amplifier such as an operational amplifier, or may be any other type of suitable amplifier such as a single transistor amplifier. Output 432 is fed back to input 426 via feedback resistor 430. Feedback resistor 430 has a resistance proportional to the resistance values of resistors 418–422 divided by the number, N, of resistors 418–422. Input 426 may be an inverting input, and input 428 may be a non-inverting input coupled to a reference signal (e.g., ground). Phase-locked loop 400 provides an output 432 having a second jitter that is less than the jitter of the outputs of PLLs 412–416.

After having reviewed the present disclosure, one having skill in the art would appreciate that, although the present invention is discussed with respect to phase-locked loops, the invention need not be limited to phase-locked loops and that other elements may be substituted therefore as equivalents without providing a substantial change to the function or structure of the present invention. For example, any frequency generator or frequency synthesizer may be substituted for phase-locked loops 112, 114, 212, 214, 216, 312, 314, 412, 414, or 416. Phase-locked loops 100, 200, 300 and 400 may in turn be considered as a frequency generator, frequency synthesizer, clock, etc. In further embodiments, the PLLs of the present invention may be constructed to produce independent behavior such as by isolating power supplies thereto or by constructing the loop filters in the PLLs to produce independent behavior.

It is believed that the lower-jitter phase-locked loop of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. An apparatus, comprising:

means for generating a reference signal;

at least two or more means for providing an output having a predetermined frequency in response to the reference signal, each output having a first jitter value; and means for combining the outputs of said at least two or more output providing means, said combining means providing an output having a second jitter value, the second jitter value being less than the first jitter value, said combining means comprising an amplifier, a predetermined number of resistors each having a predetermined resistance, each of the predetermined number of resistors coupled between each output of said at least two or more output providing means and an input of said amplifier, respectively, and a feedback resistor coupled between an output and the input of said amplifier, the feedback resistor having a resistance proportional to a sum of all the predetermined resistances of the predetermined number of resistors divided by the predetermined number.

2. An apparatus as claimed in claim 1, at least one of said at least two or more output providing means being a phase-locked loop.

3. An apparatus as claimed in claim 1, said generating means being capable of generating the reference signal as a sinusoid.

4. An apparatus as claimed in claim 1, said combining means being capable of providing an output being representative of an average value of the outputs of said at least two or more output providing means.

5. An apparatus as claimed in claim 1, said amplifier including an operational amplifier.

6. An apparatus as claimed in claim 1, said combining means being capable of providing an analog output in response to the reference signal.

7. An apparatus, comprising:

means for generating a reference signal;

at least three or more means for providing an output having a predetermined frequency in response to the reference signal, each output having a first jitter value; and means for combining the outputs of said at least three or more output providing means, said combining means providing an output having a second jitter value, the second jitter value being less than the first jitter value, said combining means comprising a majority function circuit, said combining means including first and second stages of NAND gate circuits in which outputs of the first stage are input to the second stage.

8. An apparatus as claimed in claim 7, said generating means being capable of generating the reference signal as a digital clock signal.

9. An apparatus as claimed in claim 7, said combining means being capable of providing an output being representative of a median value of the outputs of said at least two or more output providing means.

10. An apparatus as claimed in claim 7, said combining means comprising at least one or more NOR gate circuits.

11. An apparatus as claimed in claim 7, wherein the means for providing an output including phase locked loops.

* * * * *